US008470462B2

(12) United States Patent
Horng et al.

(10) Patent No.: US 8,470,462 B2
(45) Date of Patent: Jun. 25, 2013

(54) STRUCTURE AND METHOD FOR ENHANCING INTERFACIAL PERPENDICULAR ANISOTROPY IN COFE(B)/MGO/COFE(B) MAGNETIC TUNNEL JUNCTIONS

(75) Inventors: Cheng T. Horng, San Jose, CA (US);
Ru-Ying Tong, Los Gatos, CA (US);
Guenole Jan, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 197 days.

(21) Appl. No.: 12/927,939

(22) Filed: Nov. 30, 2010

(65) Prior Publication Data

US 2012/0135273 A1    May 31, 2012

(51) Int. Cl.
*G11B 5/706* (2006.01)
*H01L 43/08* (2006.01)
*G01R 33/09* (2006.01)
*G11C 11/16* (2006.01)

(52) U.S. Cl.
USPC ........ 428/811.1; 365/158; 365/171; 365/172; 365/173

(58) Field of Classification Search
None
See application file for complete search history.

(56) References Cited

U.S. PATENT DOCUMENTS

| 7,208,807 | B2 | 4/2007 | Horng et al. | |
|---|---|---|---|---|
| 7,479,394 | B2 | 1/2009 | Horng et al. | |
| 7,732,881 | B2 | 6/2010 | Wang | |
| 7,742,328 | B2 | 6/2010 | Chen et al. | |
| 8,138,561 | B2 * | 3/2012 | Horng et al. | 257/421 |
| 2004/0041183 | A1 | 3/2004 | Slaughter et al. | |
| 2006/0164764 | A1 * | 7/2006 | Kamiguchi et al. | 360/324.1 |
| 2007/0297103 | A1 | 12/2007 | Zhang et al. | |
| 2008/0080101 | A1 * | 4/2008 | Mauri et al. | 360/324.2 |
| 2008/0299679 | A1 * | 12/2008 | Zhao et al. | 438/3 |
| 2009/0218645 | A1 | 9/2009 | Ranjan et al. | |
| 2009/0246557 | A1 * | 10/2009 | Horng et al. | 428/811.1 |
| 2009/0256220 | A1 * | 10/2009 | Horng et al. | 257/421 |
| 2009/0278218 | A1 | 11/2009 | Kim | |

(Continued)

FOREIGN PATENT DOCUMENTS

WO  PCT/US2011/001781    3/2012

OTHER PUBLICATIONS

"Current-driven excitation of magnetic multilayers," by J.C. Slonczewski, Journal of Magnetism and Magnetic Materials 159 (1996) L1-L7, Elsevier Science B.V.

(Continued)

*Primary Examiner* — Kevin Bernatz
(74) *Attorney, Agent, or Firm* — Saile Ackerman LLC; Stephen B. Ackerman (57) ABSTRACT

A STT-RAM MTJ is disclosed with a MgO tunnel barrier formed by natural oxidation process. A $Co_{10}Fe_{70}B_{20}$/NCC/$Co_{10}Fe_{70}B_{20}$, $Co_{10}Fe_{70}B_{20}$/NCC/$Co_{10}Fe_{70}B_{20}$/NCC, or $Co_{10}Fe_{70}B_{20}$/NCC/$Co_{10}Fe_{70}B_{20}$/NCC/$Co_{10}Fe_{70}B_{20}$ free layer configuration where NCC is a nanocurrent channel layer made of Fe(20%)-$SiO_2$ is used to minimize $Jc_0$ while enabling higher thermal stability, write voltage, read voltage, Ho, and Hc values that satisfy 64 Mb design requirements. The NCC layer is about 10 Angstroms thick to match the minimum Fe(Si) grain diameter size. The MTJ is annealed with a temperature of about 330° C. to maintain a high magnetoresistive ratio while maximizing $Hk\perp$(interfacial) for the free layer thereby reducing Heff and lowering the switching current. The $Co_{10}Fe_{70}B_{20}$ layers are sputter deposited with a low pressure process with a power of about 15 Watts and an Ar flow rate of 40 standard cubic centimeters per minute to lower Heff for the free layer.

12 Claims, 4 Drawing Sheets

U.S. PATENT DOCUMENTS

| | | | |
|---|---|---|---|
| 2010/0065935 | A1 | 3/2010 | Horng et al. |
| 2010/0178528 | A1 | 7/2010 | Tsunekawa et al. |
| 2010/0240152 | A1* | 9/2010 | Wang .............................. 438/3 |
| 2011/0014500 | A1* | 1/2011 | Horng et al. ............... 428/846.3 |
| 2012/0040207 | A1* | 2/2012 | Horng et al. ............... 428/811.1 |

OTHER PUBLICATIONS

"Estimation of spin transfer torque effect and thermal activation effect on magnetization reversal in CoFeB/MgO/CoFeB magnetoresistive tunneling junctions," by M. Yoshikawa et al., Journal of Applied Physics 101, 09A511 (2007), pp. 1-3.

"Reducing the critical current for spin-transfer switching of perpendicularly magnetized nanomagnets," by S. Mangin et al., Applied Physics Letters 94, 012502 (2009), pp. 1-3.

"Comparison of Scaling of In-Plane and Perpendicular Spin Transfer Switching Technologies by Micromagnetic Simulation," by D. Apalkov et al., IEEE Transactions on Magnetics, vol. 46, No. 6, Jun. 2010, pp. 2240-2243.

"230% room-temperature magnetoresistance in CoFeB/MgO/CoFeB magnetic tunnel junctions," by D. D. Djayaprawira et al., Applied Physics Letters 86, 092502 (2005). pp. 1-3.

"A perpendicular-anisotropy CoFeB-MgO magnetic tunnel junction," by S. Ikeda et al., Nature Materials, Letters published online: Jul. 11, 2010, DOI: 10.1038/NMAT2804, www.nature.com/naturematerials, pp. 1-4.

"Tunneling giant magnetoresistance in heterogeneous Fe-SiO2 granular films," by S. Honda et al., Physical Review B, vol. 56, No. 22, Dec. 1, 1997—II, pp. 14 566 to 14 573.

Co-pending U.S. Appl. No. 12/460,412, filed Jul. 17, 2009, "Structure and Method to Fabricate High Performance MTJ Devices for Spin-Transfer Torque (STT)-RAM Application," assigned to the same assignee as the present invention.

Suok-Min Na et al., "Effect of Boron Addition on Magnetostrictive and Mechanical Properties in Rolled Polycrystalline Fe-187%Ga Alloy," MRS Proceedings. 888:0886-V06-07, 2006, [retrieved on Feb. 16, 2012] from the internet: <URL: http://journals.cambridge.ort/action/displayAbstract;jsessionid=C68F193E685FC97E4EB34C718FF4D720.journals? fromPage=online&aid=802270>.abstract.

* cited by examiner

STRUCTURE AND METHOD FOR ENHANCING INTERFACIAL PERPENDICULAR ANISOTROPY IN COFE(B)/MGO/COFE(B) MAGNETIC TUNNEL JUNCTIONS

RELATED PATENT APPLICATION

This application is related to the following: Ser. No. 12/460,412, filing date Jul. 17, 2009; which is assigned to a common assignee and is herein incorporated by reference in its entirety.

FIELD OF THE INVENTION

The invention relates to a high performance Magnetic Tunneling Junction (MTJ) element and a method for making the same, and in particular, to a spin transfer torque (STT-RAM) device that achieves low switching current and high dR/R by incorporating a free layer having a FL1/NCC/FL2 or FL1/NCC/FL2/NCC/FL3 configuration in which a nanocurrent channel (NCC) layer magnetically and electrically couples adjoining ferromagnetic layers FL1 and FL2 in a single NCC structure or FL1, FL2, and FL3 ferromagnetic layers in a dual NCC structure.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-RAM on a gigabit scale.

Figure 1:
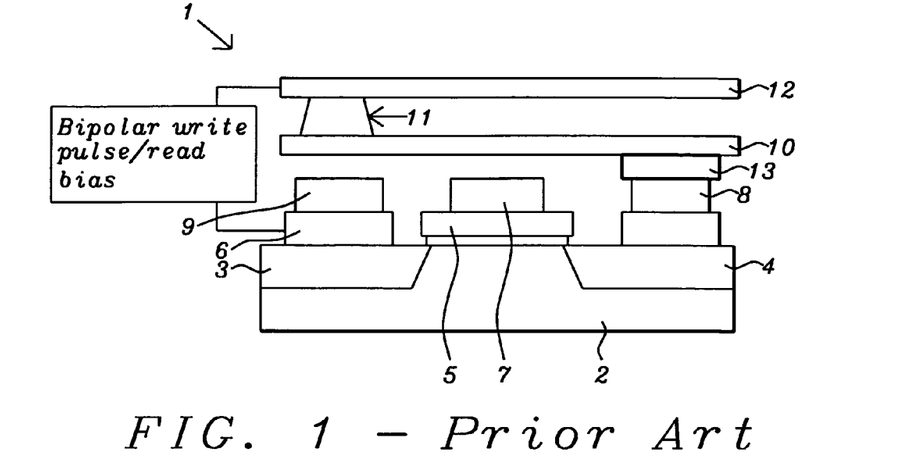
FIG. 1 is a cross-sectional view showing a memory cell in a conventional STT-RAM device.

As shown in FIG. 1, one example of a memory cell in a STT-RAM 1 includes a gate 5 formed above a p-type semiconductor substrate 2, a source 3, drain 4, word line (WL) 7 above the gate, and a source line 9. There is also a bottom electrode (BE) 10 formed above the source line 9 and word line 7, and a MTJ cell 11 between the BE and bit line (BL) 12. There is a Cu stud 6 connecting the source 3 to BL 12, and a via 13 and Cu stud 8 to connect BE 10 to drain 4. Thus, the transistor source 3 and drain 4 are connected to the MTJ 11 so that DC current may flow across the MTJ.

Both field-MRAM and STT-RAM have a MTJ element based on a tunneling magneto-resistance (TMR) effect wherein a stack of layers has a configuration in which two ferromagnetic layers are separated by a thin non-magnetic dielectric layer. The MTJ element is typically formed between a bottom electrode such as a first conductive line and a top electrode which is a second conductive line at locations where the top electrode crosses over the bottom electrode.

As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. For this reason, a new type of device called a spin transfer (spin torque) device was developed. Compared with conventional MRAM, spin-transfer torque or STT-RAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-RAM and a conventional MRAM is only in the write operation mechanism. The read mechanism is the same.

For STT-RAM to be viable in the 90 nm technology node and beyond, the ultra-small MTJs (also referred to as nanopillars or nanomagnets herein) must exhibit a TMR ratio that is much higher than in a conventional MRAM-MTJ which uses AlOx as the tunnel barrier and a NiFe free layer. Furthermore, the critical current density (Jc) must be lower than about $10^6$ A/cm$^2$ to be driven by a CMOS transistor that can typically deliver 100 μA per 100 nm gate width. A critical current for spin transfer switching (Ic), which is defined as $[(Ic^+ + Ic^-)/2]$, for the present 180 nm node sub-micron MTJ having a top-down oval shaped area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin tunnel barrier made of AlOx, MgO, or the like. Thus, for high density devices such as STT-RAM on a gigabit scale, it is desirable to decrease Ic (and its Jc) by approximately an order of magnitude so as to avoid an electrical breakdown of the MTJ device and to be compatible with the underlying CMOS transistor that is used to provide switching current and to select a memory cell.

Under a macrospin model, the critical switching current density Jc at zero temperature is expected to have the form:

$$Jc \sim 2e\alpha Mst(Ha+Hk+Hdip-4\pi Ms)/\hbar \eta = 2e\alpha Mst (Heff)/\hbar \eta \quad (1)$$

where e is the electron charge, α is a Gilbert damping constant, Ms and t are the magnetization and thickness of the free layer, $\hbar$ is the reduced Plank's constant, η is the spin-transfer efficiency which is related to the spin polarization (P), Ha is the external applied field along the easy axis, Hk is the effective anisotropy field including magnetocrystalline anisotropy and shape anisotropy (in an in-plane magnetized bit, Hk is dominated by shape anisotropy), Hdip is the dipolar field from the reference layer, and 4π Ms arises from the demagnetization field of the thin film geometry. In a MTJ structure (F/I/F) where F is a ferromagnetic layer and I is an insulator layer, when the spin relaxation distance is much larger than the ferromagnetic film thickness, the spin continuity holds true, i.e., the sum of interfacial torques from both left and right sides equals the net inflow of spin current. As the magnetization is fixed on one side, the other side magnetization will experience an in-plane torque of $T=-(\hbar P_L J_0/2e)\sin(\theta)$ where e is the electron charge, $P_L$ is tunneling polarization parameter, $J_0$ is electric current density, and θ is the angle between the magnetizations on the two sides of the tunnel barrier (insulator). Thus, spin transfer efficiency is a function of current polarity, polarization P, and the relative angle θ between the free and pinned layer as represented in the following equation:

$$\eta(\theta) = P/[2(1+P^2 \cos\theta)]$$

At a finite temperature, thermal agitation plays an important role in reducing the switching current at long current pulses (>10 ns) according to M. Yoshikawa et al. in "Estimation of spin transfer torque effect and thermal activation effect on magnetization reversal in CoFeB/MgO/CoFeB magnetoresistive tunneling junctions", J. Appl. Phys. 101, 09A511 (2007). In this thermal activated switching regime, the switching current is dependent on the current pulse width $\tau$ and thermal stability factor $\Delta=Eb/k_RT$, where $Eb=MsVHk/2$ which is independent of the demagnetization field $4\pi Ms$. For an in-plane magnetized bit, demagnetization field $4\pi Ms$ (several thousand Oersted) is much greater than Ha and shape anisotropy Hk, and dipole field Hdip (hundred Oersted). Therefore, the value of $Heff=4\pi Ms$ restricts efforts to reduce Jc. For an out-of-plane bit, the easy axis is perpendicular to the film plane thereof and $Heff=Hk\perp-4\pi Ms$.

Magnetization switching behavior at positive and negative biases in STT switching is related to the following: (a) the STT effect; (b) the thermal activation effect due to the Joule heating; and (c) the magnetic excitation effect due to the hot electron. Dynamic behavior of a STT-MTJ depends highly on thermal fluctuation within the device which means a temperature increase within the free layer will play an important role in assisting the switching process.

Within the assumption of equation (1), low critical currents while maintaining thermal stability can be achieved by a perpendicularly magnetized nanomagnet as described by S. Magnin et al. in "Reducing the critical current for spin-transfer switching of perpendicularly magnetized nanomagnet", APL 94, 012502 (2009). Furthermore, spin transfer torque memory has been investigated for in-plane and perpendicular technologies by micromagnetic simulation by D. Apalka et al in "Comparison of scaling of in-plane and perpendicular spin transfer switching technologies by micromagnetic simulation", IEEE Trans. Magn. 46, 2240 (2010). There is data to show that in-plane technology has excellent scalability down to the 20 nm width of the cell whereas perpendicular technology has a switching current which is substantially independent of pulse width $\tau$, and a switching voltage that increases rapidly at smaller nodes, thereby requiring significant efforts to design new high polarization and low damping materials.

For STT-RAM applications, the ultra small MTJ element hereafter referred to as a nanomagnet must exhibit a high tunneling magnetoresistive ratio (TMR or dR/R) at low resistance×area (RA) values of less than 20 ohm-$\mu m^2$. Note that dR is the maximum change in resistance in a MTJ and R is the minimum resistance of the MTJ. D. Dyayaprawira et al. have recently demonstrated in "230% room temperature magnetoresistance in CoFeB/MgO/CoFeB MTJ", Appl. Phys. Lett. 86, 092502 (2005), that a highly oriented CoFeB/MgO/CoFeB MTJ is capable of delivering dR/R of 230% but with a RA=420 ohm-$\mu m^2$.

U.S. Patent Application 2010/0065935 describes a free layer with a $Co_{40}Fe_{40}B_{20}/NCC/Co_{40}Fe_{40}B_{20}$ configuration wherein the NCC layer has a $FeSiO_2$ composition made by sputter depositing a Fe(25 atomic %)-$SiO_2$ target. U.S. Patent Application 2009/0218645 also discloses a MTJ with a CoFeB free layer having a nano-current channel (NCC) layer therein.

U.S. Pat. No. 7,732,881 discloses a CoFe/NCC/CoFe free layer configuration in which the NCC layer may be comprised of Fe—$SiO_2$ or FeCo—$SiO_2$.

U.S. Pat. No. 7,742,328 describes a free layer having at least two ferromagnetic layers separated by non-magnetic spacer layers wherein each spacer layer may be a nano-oxide layer conductive to ballistic magnetoresistive.

To our knowledge, none of the prior art references provide a MTJ that has a thermal stability factor of at least 55 and a Hc of at least 160 Oe to satisfy 64 Mbit STT-RAM requirements.

Thus, it is essential to develop a MTJ where all of a high TMR ratio, low RA, thermal stability factor$\geq$55, Hc$\geq$160 Oe, and a current driven switching capability required for high performance STT-RAM are achievable.

SUMMARY OF THE INVENTION

One objective of the present invention is to provide a MTJ element that is able to satisfy design requirements for advanced devices including a 64 Mb STT-MRAM wherein the thermal stability factor $\Delta$ is greater than 55 and Hc is at least 160 Oe.

A second objective of the present invention is to provide a MTJ according to the first objective that also reduces the undesirable soft breakdown (SBD) component of Vbd (breakdown voltage) to <0.1%.

According to one embodiment, these objectives are achieved by providing a substrate comprised of a bottom conductor electrode (BE) on which a spin-transfer (STT)-RAM structure is fabricated. The BE is typically a composite and preferably has an uppermost Ta layer that is sputter etched to form an amorphous surface to promote smooth and flat overlying layers in the MTJ. Thereafter, a MTJ stack of layers is deposited on the BE. In one aspect, the MTJ stack has a bottom spin valve configuration in which a seed layer, AFM layer, pinned layer, tunnel barrier layer, free layer, and a capping layer/hard mask layer are sequentially formed on the BE. The seed layer is preferably NiCr and the AFM layer may be comprised of MnPt or IrMn, for example. Preferably, the pinned layer has an AP2/Ru/AP1 configuration where the AP2 layer contacts the AFM layer and the AP1 layer contacts the tunnel barrier layer. The AP1 layer may be comprised of CoFe, CoFeB, or a combination thereof.

The tunnel barrier layer is preferably comprised of MgO made by a natural oxidation method in order to minimize the RA value. A key feature in one embodiment is that the free layer is a composite comprised of a nanocurrent channel (NCC) layer formed between a lower magnetic. FL1 layer contacting the tunnel barrier and an upper magnetic FL2 layer. In one aspect, the NCC layer has magnetic and electrically conductive RM grains formed within an insulator matrix represented by RMO, RMN, or RMON where R is Fe, Co, Ni, or an alloy thereof, and the metal (M) is Si, Al, or another element that is capable of forming oxides, nitrides, or oxynitrides. Preferably, the NCC layer thickness is essentially the same value in Angstroms as the minimum RM grain size which for Fe(Si) is about 10 Angstroms in a $FeSiO_2$ NCC layer. The magnitude of Joule heating generated during a write pulse is inversely proportional to the Fe content in the $FeSiO_2$ layer so that Fe(20 atomic %)-$SiO_2$ is preferred over a Fe(25 atomic %)-$SiO_2$ or a Fe(30 atomic %)-$SiO_2$ NCC layer.

The FL1 and FL2 layers may be made of CoFe or $Co_SFe_{(80-S)}B_{20}$ where S is from 10 to 20 in order to increase spin polarization and enable a lower switching current density ($J_{CO}$) than $Co_SFe_{(80-S)}B_{20}$ free layers where S$\geq$20. Preferably, the FL1 layer is thicker than the FL2 layer. In one embodiment, a Ru/Ta capping layer is formed on the FL2 layer. In addition, a hard mask may be employed on the capping layer.

In yet another embodiment, the free layer may have a dual NCC configuration represented by FL1/NCC1/FL2/NCC2/FL3 in which the lower magnetic layer (FL1), middle magnetic layer (FL2), and upper magnetic layer (FL3) may all be comprised of CoFeB, CoFe, or a combination thereof. Furthermore, each NCC layer may be comprised of R(M) grains formed in an oxide, nitride, or oxynitride insulator matrix.

Each NCC layer has a thickness less than or equal to the R(M) minimum grain size. The dual NCC configuration provides higher Bs and a larger Hc but increases $J_{C0}$ slightly compared with a single NCC free layer. In an alternative embodiment, the dual NCC configuration may be represented by FL1/NCC1/FL2/NCC2 wherein the upper FL3 layer is omitted from the previous dual NCC structure.

All of the layers in the MTJ stack may be formed by sputtering or ion beam deposition (IBD). CoFeB FL1, FL2, and FL3 layers are preferably deposited with a low pressure sputtering process for optimum performance. Once all the layers in the MTJ stack are laid down, a thermal anneal process may be employed to fix the pinned layer magnetization (easy-axis) direction.

DETAILED DESCRIPTION OF THE INVENTION

The present invention is a MTJ element (nanopillar) that provides low $J_{C0}$ and high thermal stability to enable enhanced performance necessary for advanced devices including 64 Mb STT-RAMs. The present invention also includes a method of forming a MTJ element for an ultra high density STT-RAM device. Although the exemplary embodiment depicts a bottom spin valve configuration, the present invention also encompasses a top spin valve design and dual spin valves as appreciated by those skilled in the art. A "top view" as described herein is defined as a viewpoint from a position above the plane of the substrate in the STT-RAM device. Note that the thicknesses for the magnetic layers and NCC layers in the free layer configuration described in various embodiments are based on a MagIC measurement scale and are thinner than determined by a HR-TEM (high resolution-transmission electron microscopy) measurement. In general, a conversion factor of 1.3 should be applied which means a 13.5 Angstrom ferromagnetic layer in the present invention is equivalent to an 18 Angstrom thickness based on a HR-TEM measurement used in the industry. Thickness values for other layers are reported as measured by HR-TEM.

In a related patent application Ser. No. 12/460,412, we disclosed a MTJ with a low switching current density $J_C$ approaching $1\times10^6$ A/cm$^2$ and a RA<10 Ohm-um$^2$ that is realized by employing a FL1/NCC/FL2 composite free layer wherein FL1 and FL2 are $Co_sFe_{(80-S)}B_{20}$ free layers in which s has been lowered from 40 to 20, and where the NCC layer is formed by low pressure sputter deposition from a Fe(25 atomic %)-SiO$_2$ target. Since the spin current passes only through the nano-conducting channels, a significant amount of Joule heating is produced that thermally assists writing of the free layer. We were motivated to further improve MTJ structures based on spin transfer torque switching since existing technology does not meet all requirements for advanced devices such as 64 Mb STT-RAMs, 256 Mb STT-RAMs, or even higher density devices. In particular, there is a need to realize a Hc>160Oe for storage, and a thermal stability factor (Eb)>55 while maintaining a high TMR ratio, a RA below 10, and a $J_{C0}$ less than $2\times10^6$ A/cm$^2$.

Figure 2:
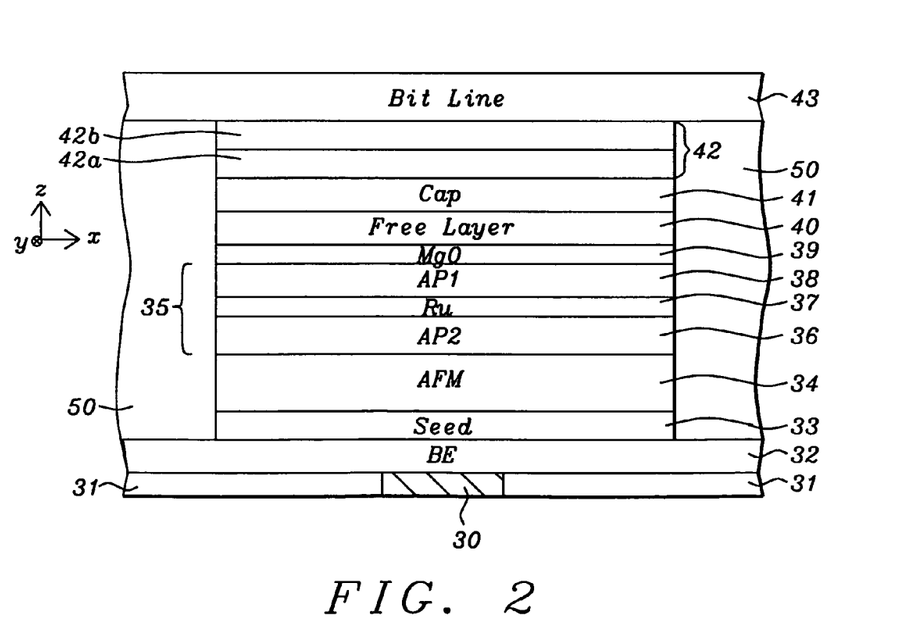
FIG. 2 is a cross-sectional view of a STT-RAM with a MTJ nanopillar formed according to an embodiment of the present invention.

Referring to FIG. 2, one embodiment of a MTJ according to the present invention is depicted. A MTJ comprised of layers 33-42 is formed between a bottom electrode (BE) 32 and a bit line 43 in a STT-RAM array (not shown). BE 32 may be a composite layer comprised of a lower seed layer, middle conductive layer, and upper capping layer. In one embodiment, BE 32 has a TaN/NiCr/Ru/Ta configuration in which the lower TaN layer (not shown) is formed on a substrate that may be an insulation layer 31 comprised of silicon oxide or the like and the uppermost Ta layer contacts the seed layer 33. The insulation layer 31 may have a metal stud 30 formed therein so that electrical contact can be established between bit line 43 and a word line (not shown) in a sub-structure below the substrate. In one example, the thicknesses of the TaN, NiCr, Ru, and Ta layers are 30, 30, 100, and 120 Angstroms, respectively. However, the thickness of the various bottom electrode layers may be adjusted higher or lower to optimize performance as appreciated by those skilled in the art.

In another embodiment, the BE 32 includes at least an uppermost Ta layer (not shown) that may be subjected to sputter etching or ion milling to form an amorphous surface. The present invention also anticipates that an oxygen surfactant layer (OSL) may be formed on the Ta surface of the bottom electrode according to a method we previously disclosed in U.S. Pat. No. 7,208,807 where a sputter etched Ta layer is exposed to an oxygen environment for a certain period of time.

Returning to the exemplary embodiment, an amorphous Ta top surface 32s on BE 32 is especially advantageous in promoting a uniform and dense growth in subsequently formed MTJ layers. The most critical layers in the MTJ stack are the tunnel barrier 39 and free layer 40. The tunnel barrier 39 must be extremely uniform over the wafer since small variations in thickness will result in a large variation in the resistance and in the RA value. In one embodiment, BE 32 is patterned to form an array of BE lines from a top view (not shown). Then, an insulation layer (not shown) is deposited and planarized by a conventional method to become coplanar with BE 32.

In the exemplary embodiment, a MTJ stack is fabricated on the patterned BE 32 by sequentially forming a seed layer 33, AFM layer 34, synthetic anti-ferromagnetic (SyAF) pinned layer 35, MgO tunnel barrier 39, free layer 40, capping layer 41, and hard mask layer 42. Seed layer 33 is preferably NiCr but may be comprised of NiFe, NiFeCr, or other suitable seed layer materials. When a NiCr seed layer is grown on a Ta surface 32s or on an oxygen surfactant treated α-Ta surface in the bottom electrode 32, a smooth and dense (111) NiCr crystal orientation results which promotes smooth and densely packed growth in subsequently formed MTJ layers.

The AFM layer 34 is preferably comprised of MnPt with a thickness in the range of 120 to 200 Angstroms although an IrMn layer about 50 to 100 Angstroms thick or other materials such as NiMn, OsMn, RuMn, RhMn, PdMn, RuRhMn, or MnPtPd are also acceptable. SyAF pinned layer 35 may have a AP2/coupling/AP1 configuration to improve thermal stability of the MTJ and also reduce the interlayer coupling Hin (offset) field applied to the free layer. Preferably, the AP2 layer 36 is made of CoFe, the coupling layer 37 is Ru, and the AP1 layer 38 is comprised of CoFe, CoFeB, or a combination thereof such as CoFeB/CoFe. In one embodiment, a CoFeB/CoFe AP1 layer 38 is used in combination with an amorphous CoFeB free layer 40. In another embodiment, a CoFeB AP1 layer 38 is employed in combination with a crystalline CoFeB free layer 40. A crystalline CoFeB free layer may have a CoFeB/NCC/CoFeB configuration wherein the NCC (nano-conducting channel) layer may be substantially amorphous in character. It should be understood that the thickness of the AP2 layer 36 and AP1 layer 38 may be changed to adjust the Ho (offset field) to approximately 0 Oe. In a preferred embodiment, a small negative Ho value between 0 and −20 Oe is desired since higher switching current is required for P to AP switching than AP to P switching, and the former process is facilitated by a slightly negative Ho value.

Preferably, the tunnel barrier 39 is made of MgO and is formed by a natural oxidation (NOX) process as previously described in related patent application Ser. No. 12/460,412. Tunnel barrier 39 forms an interface with AP1 layer 38. Furthermore, we have found that inserting an oxygen surfactant layer (OSL) within the MgO tunnel barrier provides an advantage over prior art MgO layers in that the undesirable soft breakdown (SBD) component of Vbd (breakdown voltage) is reduced. For example, a first Mg layer may be deposited followed by a NOX process and then a second Mg layer is deposited on the oxidized first Mg layer. An oxygen surfactant layer may be formed on the second Mg layer prior to depositing a third Mg layer. A subsequent annealing step after the remaining MTJ layers are laid down forms an essentially uniform MgO layer wherein the third Mg layer in the tunnel barrier stack is oxidized by oxygen diffusion from the OSL and by gettering oxygen from the free layer 40. It should be understood that a Vbd distribution plot (not shown) generally has a bimodal distribution in which the "majority" mode is for devices showing "high" or normal Vbd and a "minority" mode for devices with a "lower" or softer Vbd (SBD). SBD is related to imperfections such as defects in the MgO barrier layer.

Our method involving a DC sputtering process with a metallic Mg target results in a uniform Mg film that is particulate free. The desired RA value for a STT-RAM MTJ in a 64 Mb design is less than about 8 ohm-$\mu m^2$ and can be achieved by adjusting Mg thickness and NOX process conditions. Typically, the NOX process comprises an oxygen flow rate of 0.1 to 1 standard liters per minute (slm) for a period of 30 to 500 seconds and with an oxygen pressure from 0.05 to 1 torr.

It is known by those skilled in the art that a MTJ made from a crystalline (001) MgO tunnel barrier and a (001) CoFeB free layer is capable of delivering a very high dR/R that results from coherent tunneling in which electron symmetry of the ferromagnetic electrode is preserved in tunneling through the crystalline (001) MgO tunnel barrier. The most common CoFeB composition is represented by $Co_SFe_{(80-S)}B_{20}$ where the content of B is 20 atomic % and S is the atomic % of Co. The as-deposited CoFeB film has an amorphous phase structure and remains amorphous unless recrystallization occurs by annealing above 300° C. Even though a CoFeB free layer has a somewhat higher intrinsic damping constant than a CoFe free layer, a crystalline (001) CoFeB free layer resulting from annealing above 300° C. has a high polarization that leads to significantly higher dR/R than a CoFe free layer. Nevertheless, the present invention encompasses a free layer comprising either CoFe or CoFeB, or a combination thereof.

Our measurements of unpatterned MTJ stacks revealed that Gilbert's damping constant α decreases from 0.02 for a single $Co_{20}Fe_{60}B_{20}$ (19.5 Angstroms thick) free layer to 0.01 when a NCC layer is inserted to give a $Co_{20}Fe_{50}B_{20}$15.5/NCC8/$Co_{20}Fe_{60}B_{20}$10 configuration wherein the thicknesses of the lower and upper CoFeB layers are 15.5 and 10 Angstroms, respectively, and the middle NCC=Fe(25 atomic %)-$SiO_2$ layer has an 8 Angstrom thickness.

Interfacial perpendicular anisotropy referred to as Hk⊥ (interfacial) between oxide and magnetic metal has been predicted by first principles calculation. When a CoFe or CoFeB layer, which normally has in-plane magnetization, adjoins an oxide layer such as MgO or AlOx, for example, the magnetization of the CoFe or CoFeB layers can be aligned out-of-plane.

Figure 8:
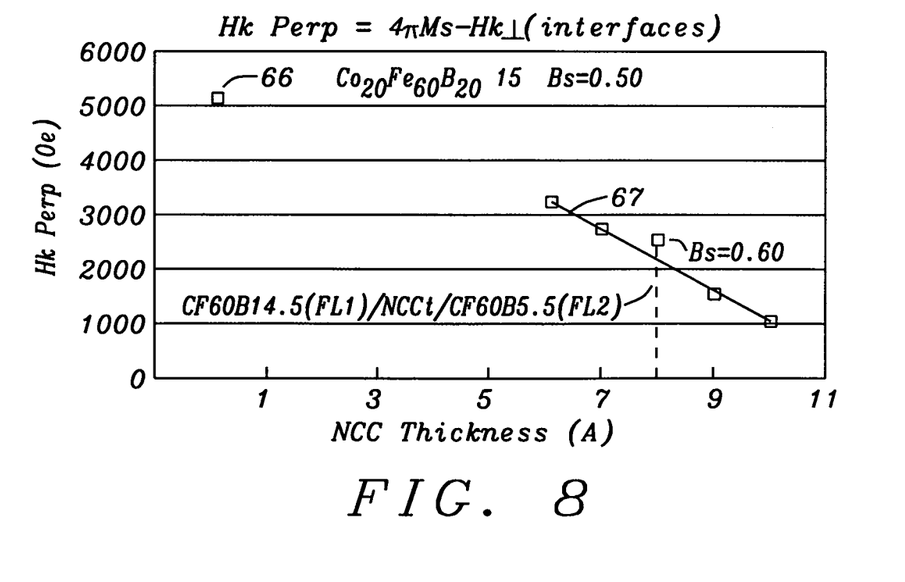
FIG. 8 is a plot of NCC thickness vs. Heff for a MTJ formed according to an embodiment of the present invention.

Referring to FIG. 8, a MTJ with a single $Co_{20}Fe_{60}B_{20}$15 free layer (no NCC) and a so called NCC-MTJ with a $Co_{20}Fe_{50}B_{20}$14.5(FL1)/NCCt/$Co_{20}Fe_{60}B_{20}$5.5(FL2) free layer configuration wherein lower and upper CoFeB layers are designated as FL1 and FL2, respectively, are measured by a vibrating sample magnetometer (VSM) to determine the magnetic field perpendicular to the film plane. For the single free layer (point 66), Heff (i.e. 4αMs−Hk⊥) is around 6000 Oe (at Bs=0.5) while Heff is 2000 Oe for the NCC-MTJ (line 67) where the NCC layer has an 8 Angstrom thickness (t=8) and is generated by sputtering a Fe(25 atomic %)-$SiO_2$ target. Hk⊥ in this case is the interfacial perpendicular anisotropy described below due to MgO/CoFeB/Ta and MgO/CoFeB/Fe—$SiO_2$/CoFeB/Ta interfaces previously reported in related patent application Ser. No. 12/460,412. Thus, Hk⊥(interface) in the MgO/CoFeB14.5/Fe—$SiO_2$8/CoFeB5.5/Ta structure is greater than in the MgO/CoFeB15/Ta configuration where Ta represents a capping layer.

S. Ikeda et al. in "A perpendicular-anisotropy CoFeB—MgO magnetic tunnel junction", Nature Material, DOI: 10.1038/NMAT2804 disclose a MTJ consisting of Ta50/Ru100/Ta50/$Co_{20}Fe_{60}B_{20}$(10-13)/MgO(8.5 or 9)/ $Co_{20}Fe_{50}B_{20}$(10-17)/Ta50/Ru50 which is processed into circular devices. Information relating to Hk and α was obtained by FMR measurements performed on two types of stack structures including CoFeB(10-20)/MgO10 which relates to the bottom CoFeB layer in their MTJ configuration, and MgO/CoFeB(5-30)/Ta50 which relates to the top CoFeB layer in their MTJ. Results show that Hk increases as thickness is reduced and changes its sign Hk(+) to Hk(−) reflecting the change in magnetic easy axis direction from in-plane to perpendicular at a CoFeB thickness around 15 Angstroms. Note that Ikeda's MTJ is likely measured by HR-TEM so that a $Co_{20}Fe_{50}B_{20}$15 layer in the reference is equivalent to our $Co_{20}Fe_{50}B_{20}$11.5 layer. The magnitude of α rapidly increases as the free layer thickness is reduced below 20 Angstroms. For a 40 nm diameter MTJ, $Jc_0$ (ave) and thermal stability factor Δ for the Ta50/Ru100/Ta50/$Co_{20}Fe_{50}B_{20}$13/MgO(8.5 or 9)/$Co_{20}Fe_{60}B_{20}$17/Ta50/Ru50 perpendicular MTJ are 3.9× $10^6$ A/$cm^2$ and 43, respectively. The magnitude of $Jc_0$ achieved is comparable to that for in-plane anisotropy MTJs. For this perpendicular-anisotropy MTJ (p-MTJ), there is a very high free layer offset field (Ho) which was measured to be about 300 Oe. Unfortunately, a high Ho of this magnitude may prevent a p-MTJ from being accepted in STT-RAM devices.

In related patent application Ser. No. 12/460,412, we found that a lower switching current density $J_C$ was realized by lowering "S" from 40 to 20 in $Co_SFe_{(80-S)}B_{20}$ and employing a $Co_{20}Fe_{60}B_{20}$ alloy rather than a $Co_{40}Fe_{40}B_{20}$ alloy in the free layer of a STT-RAM MTJ since the former alloy has a higher polarization and lower damping factor than the latter. According to equation (1) and the equation $\eta(\theta)=P/[2(1+P^2 \cos\theta)]$ presented previously, a free layer having higher polarization (P) and lower damping constant results in lower switching current density Jc.

Figure 3:
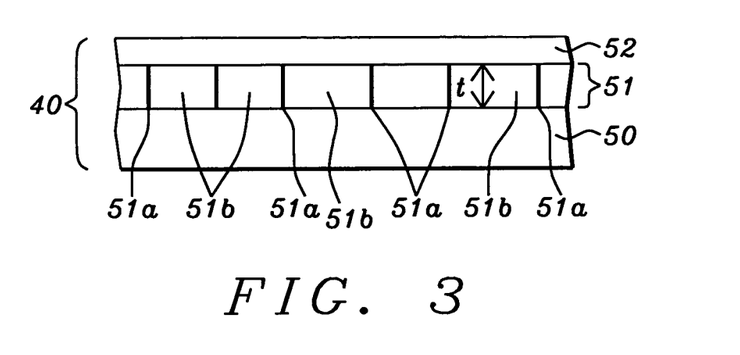
FIG. 3 is an enlarged cross-sectional view of the composite free layer in the MTJ nanopillar from FIG. 2 and depicts a nano-current channel layer formed therein.

Referring to FIG. 3, in one embodiment of the present invention, free layer 40 is preferably a composite that includes a lower (FL1) magnetic layer 50, an upper (FL2) magnetic layer 52, and a middle nanocurrent channel (NCC) layer 51 with a thickness t of 6 to 10 Angstroms that is essentially the same value in Angstroms as the minimum RM grain size in the RMO, RMN, or RMON NCC layer. Note that RM grains are formed in an oxide, nitride, or oxynitride layer in RMO, RMN, and RMON NCC compositions, respectively. The magnetic layers 50, 52 are preferably made of CoFeB with a Co content between 10 atomic % and 20 atomic % and having a low magnetic damping constant but also may be comprised of CoFe or a combination thereof such as CoFeB/CoFe. We have discovered that reducing the Co content to <20 atomic % in a CoFeB alloy provides an even lower $J_C$ than previously achieved as described in a later section. Free layer 40, and in particular FL1 layer 50, forms an interface with tunnel barrier 39 and an interface with NCC layer 51.

Upper magnetic layer 52 has a smaller thickness of about 6 to 10 Angstroms (8-13 Angstroms by HR-TEM measurement) compared with the lower magnetic layer 50 which has a thickness between 14.5 and 15.5 Angstroms (19-20 Angstroms by HR-TEM). Preferably, the lower (FL1) magnetic layer 50 has a thickness sufficiently large to form a continuous film which is believed to occur at approximately 13 Angstroms or slightly above that thickness value. However, raising FL1 thickness too high results in a higher $J_{C0}$. On the other hand, FL2 thickness is maintained below about 12 Angstroms to achieve a paramagnetic behavior in the absence of ferromagnetic coupling. It should be understood that FL1-FL2 coupling through the middle NCC layer 51 produces a ferromagnetic property in the FL2 layer 52. Thus, when the lower magnetic layer 50 is switched, the coupling will also result in FL2 layer 52 reversing its magnetic moment. A greater FL2 thickness increases Bs and VR which is desirable, but unfortunately $J_{C0}$ also increases.

In an embodiment where the AP1 layer 38, FL1 layer 50, FL2 layer 52 are all comprised of CoFeB, the CoFeB composition such as $Co_{10}Fe_{70}B_{20}$ is preferably the same for each layer. As disclosed in related patent application Ser. No. 12/460,412, we have discovered an improvement in the CoFeB layer deposition method by employing a lower pressure and lower power than previously practiced. For example, the sputter deposition may be modified to reduce power from about 50 Watts to 15 Watts and the Ar flow rate may be reduced from approximately 100 standard cubic centimeters per minute (sccm) to about 40 sccm. As a result, more uniform AP1, FL1, and FL2 layers are produced that improve magnetic properties of the MTJ.

Another important feature of the present invention is the middle NCC layer 51 made of RMO, RMN, or RMON where R is Fe, Co, Ni, or an alloy thereof such as CoFe, M is a metal such as Si or Al, and RM grains are formed as conductive channels in the metal (M) oxide, metal nitride, or metal oxynitride insulator matrix. In one embodiment, M is Si, and RSiO, RSiN, and RSiON are composites in which conductive R(Si) grains such as Fe(Si) or Co(Si) are magnetically and electrically coupled with the adjacent magnetic layers 50, 52, and are formed in an amorphous silicon oxide, silicon nitride, or silicon oxynitride insulator matrix. The R(Si) grains such as Fe(Si) or Co(Si) are typically formed in columnar shapes that may extend from the lower magnetic layer 50 to the upper magnetic layer 52. FL1 layer 50 and FL2 layer 52 are ferromagnetically coupled and therefore have a magnetic moment in the same direction. The magnetization direction of layers 50, 52 may either be aligned parallel or anti-parallel to the magnetization direction of AP1 reference layer 38. A FeSiO NCC layer is also referred to as a Fe—$SiO_2$ layer. In another aspect, R is Co or Fe, and M is Al to produce a CoAlO or FeAlO NCC layer 51. In some cases, the combination of R and M is limited because a suitable RMO sputter deposition target cannot be manufactured. For example, current technology does not enable a suitable Co—$SiO_2$ or Fe—AlOx target to be made. However, the present invention anticipates that an RMO layer may also be formed by co-sputtering R and MO targets.

In the exemplary embodiment that has a CoFeB/Fe—$SiO_2$/CoFeB free layer 40 configuration and a Ru capping layer 41, the spin current in the Fe—$SiO_2$ (NCC 51) portion of the free layer passes only through the nano-conducting channels 51a within a silicon oxide matrix 51b. As a result, there is high current density about 9-fold greater than in typical free layers comprised of CoFeB with no NCC layer which will cause reverse domain nucleation in which the domain wall will be pushed out by the continuous injection current in the STT-RAM until the entire free layer switches. Thermal heating caused by local current density may also contribute to magnetization switching in the two CoFeB layers. Because of the existence of reverse magnetization grains in the NCC layer and their coupling to the FL1, FL2 layers, the magnetization switching of layers 50, 52 will be much easier than when a NCC layer is not present in the MTJ. In effect, the single spin valve (MTJ) described herein behaves like a dual spin valve (DSF) but without a reduction in dR/R in that the spin polarized current is reflected back from a free layer/Ru cap layer interface and accumulates in the free layer. The enhancement of the transverse spin accumulation increases the spin torque and therefore effectively reduces the switching current.

In an embodiment where the NCC layer 51 is Fe—$SiO_2$ (also known as FeSiO), deposition is preferably accomplished by RF-magnetron sputtering from a Fe(20 atomic %)-$SiO_2$ single target to provide a NCC thickness from 5 to 8 Angstroms, and preferably 7 to 8 Angstroms. A Fe content substantially less than 20 atomic % (i.e. Fe 15 atomic %) is likely to lead to incomplete channel formation within the NCC layer thereby degrading heating capacity. According to S. Honda et al. in "Tunneling giant magnetoresistance in heterogeneous Fe—$SiO_2$ granular films", Phys. Rev. B. V56, p 14566 (1997), the volume fraction of the Fe(Si) granules in the $SiO_2$ matrix is calculated to be 0.115 for a NCC layer from sputtering of a Fe(25 atomic %)-$SiO_2$ target. The isolated Fe(Si) granules have a diameter ranging from 10 to 20 Angstroms which means a minimum grain size of about 10 Angstroms.

We have set the lower limit of granule diameter distribution (10 Angstroms) as our process of record (POR) NCC layer 51 thickness in order to ensure uniformity in the NCC channels 51a between FL1 layer 50 and FL2 layer 52. When the NCC thickness is greater than about 10 Angstroms, then some of the Fe(Si) granules fail to function as nano-current channels which leads to a high resistance in NCC layer 51 thereby increasing RA and Rp_cov of the MTJ which includes composite free layer 40. Note that a NCC layer 51 denoted herein as FeSiO8 (or NCC8) based on a MagIC scale, for example, has a thickness of 10 Angstroms (about 1.3× greater) as calibrated by a HR-TEM instrument. If the NCC thickness is too small, then the FL1-FL2 coupling is too large to increase Bs which degrades performance. High resolution transmission electron microscopy (HR-TEM) indicates a NCC layer 51 is grown as a continuous film that is flat and smooth similar to MgO tunnel barrier layer 39. Note that other RMO, RMN, or RMON layers may have an optimum thickness different than 10 Angstroms depending on the minimum grain size in the RM size distribution.

Figure 4:
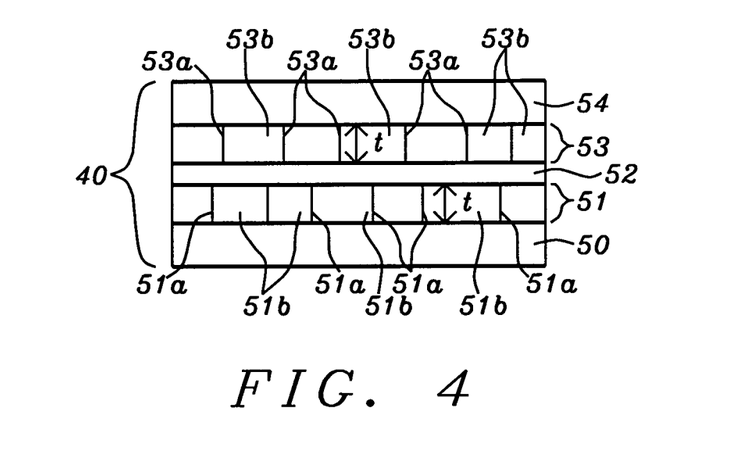
FIG. 4 is an enlarged cross-sectional view of a composite free layer in the MTJ from FIG. 2 that has a dual NCC configuration according to a second embodiment of the present invention.

Referring to FIG. 4, second embodiment of the present invention is depicted that may be referred to as a dual NCC free layer. In particular, the dual NCC free layer 40 configuration in the MTJ stack (FIG. 2) comprises the NCC free layer structure shown in FIG. 3 and an additional second NCC layer 53 and third magnetic (FL3) layer 54 sequentially formed on FL2 layer 52 to give a FL1/NCC/FL2/NCC/FL3 structure. In the exemplary embodiment, each of the NCC layers 51, 53 has a thickness from 4 to 6 Angstroms, and preferably 5 Angstroms. The dual NCC configuration has an overall NCC thickness (NCC 51+NCC 53) greater than for a single NCC layer 51 which is typically around 8 Angstroms. Note that NCC layer 53 may be comprised of the same R(M) grains formed in a metal (M) oxide, nitride, or oxynitride insulator matrix previously described with respect to NCC layer 51. Thus, more heat is generated in the granular R(M) columns 51a, 53a for thermally assisting a switch in free layer 40 magnetization than by R(M) columns 51a only. In the dual NCC free layer configuration of this embodiment, the lower FL1 layer 50 has a thickness from 13.5 to 14.5 Angstroms, FL2 layer 52 has a thickness between 4 and 5 Angstroms, and the upper FL3 layer 54 is from 6 to 8.5 Angstroms thick. Preferably, all of the ferromagnetic layers 50, 52, 54 have a composition represented by $Co_SFe_{(80-S)}B_{20}$ where "S" is between 10 and 20. Optionally, one or more of the FL1, FL2, and FL3 layers may be comprised of CoFe, or a combination of CoFe and CoFeB.

Figure 5:
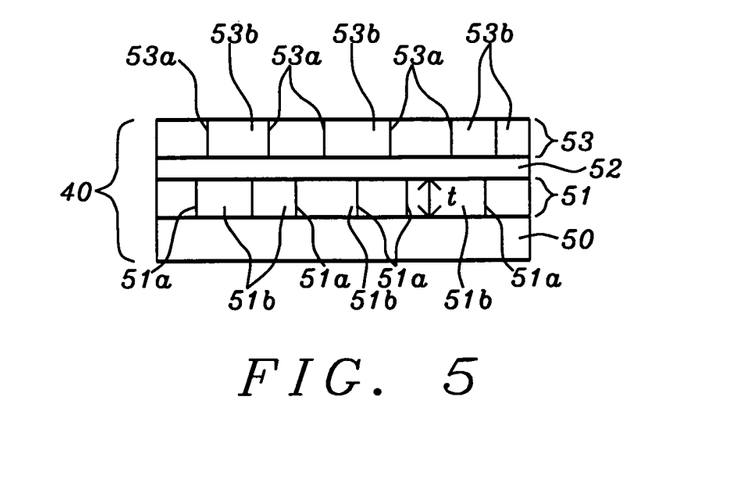
FIG. 5 is an enlarged cross-sectional view of a composite free layer in the MTJ from FIG. 2 that has a dual NCC configuration according to a third embodiment of the present invention.

Referring to FIG. 5, a third embodiment of the present invention is illustrated and retains all of the features of the dual NCC layer in the previous embodiment except the upper FL3 layer 54 is omitted and the free layer 40 has a FL1/NCC1/FL2/NCC2 configuration. In this case, upper NCC2 layer 53 is the top layer in the free layer stack instead of a FL2 or FL3 layer as in previous embodiments. Preferably, the thickness of FL1 layer 50 is from 14.5 to 15.5 Angstroms and the thickness of FL2 layer 52 is from 6 to 8.5 Angstroms. Both of NCC1 51 and NCC2 53 layers have a thickness from 4 to 6 Angstroms, and preferably 6 Angstroms.

Returning to FIG. 2, a cap layer 41 is formed on free layer 40 and may be comprised of Ru having a thickness of 10 to 30 Angstroms, and preferably 30 Angstroms. In another embodiment, one or more other metals such as Ta may be employed as a capping layer either as a single layer, an alloy layer, a composite layer comprised of a stack of two or more metal layers, or in combination with Ru. A thin Ru capping layer 41 not only enhances dR/R but also considerably lowers the critical current $J_{C0}$. A substantial reduction in Jc is believed to result primarily because the Ru layer serves as a strong spin scatterer for the majority electrons which leads to an enhanced spin accumulation at the FL2 layer 52/capping layer 41 interface in the first embodiment and at the FL3 layer 54/capping layer 41 interface in a dual NCC free layer configuration according to the second embodiment. The enhanced spin accumulation will increase the polarized current inside the free layer and thus produce an additional spin torque to act on the FL2 layer magnetization.

There is a hard mask layer 42 contacting a top surface of cap layer 41. Hard mask 42 may be a composite comprised of a lower MnPt layer 42a that contacts capping layer 41 and an upper Ta layer 42b on the MnPt layer. The MnPt/Ta configuration is designed especially for RIE processes used to pattern the MTJ nanopillars of this invention. Optionally, for ion beam etching (IBE) processes, alternative hard masks may be employed. According to a preferred embodiment, Ta layer 42b thickness is from 300 to 500 Angstroms, and preferably 300 Angstroms, while MnPt layer 42a thickness is from 200 to 300 Angstroms, and preferably 250 Angstroms. A MnPt layer 42a is employed to avoid using a 600 Angstrom thick Ta hard mask which would require a thicker photoresist layer (lower pattern resolution) during the hard mask patterning process. In another embodiment, hard mask 42 may be comprised of MnPt only.

The bottom electrode layer 32 and MTJ layers 33-42 may be sequentially formed on a substrate that is an insulation layer 31 made of silicon oxide, alumina, or the like and comprising a via stud 30. It should be understood that the via stud 30 is connected to a transistor drain (not shown) in an underlying sub-structure. The transistor is typically used in a write or read process that determines the resistance state of the bit cell (MTJ) once the MTJ stack of layers is patterned to form a MTJ nanopillar structure and a bit line is formed on the MTJ nanopillar. Note that unlike conventional MRAM, magnetization switching in a STT-RAM MTJ is accomplished by passing current through a bit cell and not by fields induced by current in a word line and a bit line. The bottom electrode 32 may have an area size in the "x, y" plane greater than that of overlying MTJ layers 33-42.

The MTJ stack comprised of layers 33-42 may be formed in the same process tool as the bottom electrode layer 32. For instance, the bottom electrode 32 and MTJ stack may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom electrode layer 32 and overlying MTJ layers 33-42 may be formed after a single pump down of the sputter system to enhance throughput. The NOX process and OSL process used to form the MgO barrier layer 39 is typically performed in an oxidation chamber within the sputter deposition tool.

Once the MTJ stack of layers 33-42 is laid down on the patterned BE 32, a high temperature annealing may be performed. For example, MTJ layers 33-42 may be annealed in a vacuum by applying a magnetic field of 5000 to 10000 Oe in magnitude along the x-axis (easy axis) for 1 to 5 hours at a temperature of about 300° C. to 360° C.

Thereafter, an array of MTJ elements with essentially vertical sidewalls may be fabricated by a process involving a RIE process as mentioned previously. First, a photoresist layer (not shown) is coated on the hard mask 42 and then patterned by a conventional photolithography process. A pattern of islands is formed in the photoresist layer wherein each island corresponds to the desired ellipse shape or another shape of the MTJ nanopillar from a top view. The patterned photoresist layer then functions as an etch mask during a first reactive ion etch (RIE) process in a RIE system mainframe which removes uncovered regions of the Ta hard mask layer 42b. The photoresist layer may be stripped and a second RIE process is employed to selectively etch through regions of MnPt hard mask layer 42a, capping layer 41, and underlying MTJ layers 33-40 that are not protected by hard mask 42b. As a result, the pattern of islands initially formed in the photoresist layer is transferred through the MTJ stack of layers to form an array of MTJ nanopillars. Since a RIE process is used to generate essentially vertical sidewalls in the MTJ nanopillars, a more dense array of MTJs is possible than when an ion beam etch (IBE) is employed as in the prior art.

Alternatively, when MnPt is selected as the hard mask, a photoresist pattern is transferred through the MnPt layer with a single RIE process. Then a second RIE process is used to transfer the pattern in the hard mask layer 42 through the underlying MTJ stack of layers.

Figure 6:
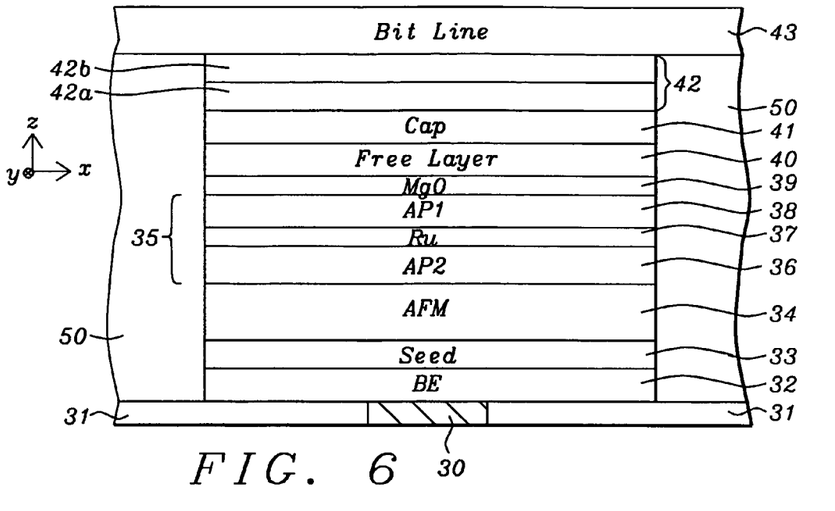
FIG. 6 is a cross-sectional view of a STT-RAM with a MTJ nanopillar formed according to a second embodiment of the present invention.

Referring to FIG. 6, the present invention anticipates an additional embodiment wherein the BE layer is not patterned before the MTJ stack of layers is deposited. Instead, the second etch process described above is extended so that the etch process continues through an unpatterned BE layer and forms a BE 32 having essentially the same shape from a top view as the overlying MTJ nanopillar. This embodiment allows a greater MTJ nanopillar density in the STT-RAM array than in the previous embodiment (FIG. 2). In this embodiment, a via stud (not shown) preferably contacts the lower surface of BE 32.

example, the seed layer is NiCr, the AFM layer is MnPt, the pinned layer has a CoFe/Ru/CoFeB/CoFe configuration, the CoFeB free layer is 19.5 Angstroms thick, and the hard mask is a MnPt/Ta composite. Additional nanomagnets labeled "Best NCC", dual NCC (I), dual NCC (II) were made with the same configuration as the reference MTJ except the free layer is modified as indicated in Table 1 to demonstrate improved performance resulting from incorporating at least one NCC layer in the composite free layer. Note that NCC8 according to a HR-TEM measurement is 10 Angstroms thick and was sputter deposited from a Fe(25 atomic %)-$SiO_2$ target. The MTJ stack is formed on a NiCr45/Ru200/Ta150 bottom electrode (BE). The MgO layer was formed by first depositing an 8 Angstrom thick Mg layer followed by in-situ oxidation (NOX with 1 torr, 1 slm $O_2$ for 100 seconds) and then sputter deposition of a 4 Angstrom thick Mg layer on the resulting MgO layer. Annealing was performed for 1 hour (10K Oe) at 330° C. After wafer annealing, the (001) MgO layer is about 10 Angstroms thick.

TABLE 1

Magnetic Properties of MTJ with BE/NiCr45/MnPt150/$Co_{75}Fe_{25}$23/Ru7.5/
$Co_{60}Fe_{20}B_{20}$15-$Co_{75}Fe_{25}$10/MgO/free layer/Ru30/MnPt300-Ta300 configuration

| Free layer (FL1, FL2, FL3 = $Co_{20}Fe_{60}B_{20}$) | Bs | RA | dR/R | Rp | Rp_cov | Hc/Ho | $J_{C0}$ | VB (mV) | VW (mV) | VR (mV) | Ea |
|---|---|---|---|---|---|---|---|---|---|---|---|
| No NCC = $Co_{20}Fe_{60}B_{20}$ 19.5 | 0.60 | 6.0 | 79% | 460 | 4.3 | 90/−22 | 8.2 | 875 | 650 | 255 | 31 |
| Best NCC = FL1 15.5/ NCC8/FL2 10 | 0.68 | 6.9 | 72% | 520 | 4.5 | 133/−14 | 2.6 | 951 | 370 | 101 | 46 |
| Dual NCC I = FL1 16.5/NCC6/FL2 10/NCC6 | 0.73 | 7.2 | 72% | 503 | 6.9 | 150/−18 | 3.7 | 988 | 415 | 105 | — |
| Dual NCCII = FL1 13.5/NCC6/FL2 4.5/NCC6/FL3 8.5 | 0.66 | 7.1 | 70% | 623 | 4.9 | 140/−18 | 4.5 | 979 | 529 | 186 | — |

In all embodiments, following formation of an array of MTJ nanopillars, a second insulation layer 50 is deposited on the BE 32 and/or substrate 31 to a level that fills in the spaces between adjacent MTJ nanopillars. A CMP process is used to remove an upper portion of the second insulation layer and thereby expose the hard mask layer 42. Thus, the second insulation layer 50 becomes coplanar with the hard mask layer. Then a conductive material such as Cu, Al, or alloys thereof may be deposited on the second insulation layer and over the hard mask 42. Next, a bit line 43 that contacts the hard mask 42 is delineated by patterning the conductive layer using a well known photoresist patterning and etching sequence.

To evaluate the magnetic performance properties of MTJs fabricated according to the present invention, an Arachne 4 Kb ADM (array development macro) chip was employed as the test vehicle. In particular, nanomagnets (MTJs) having a 55 nm×210 nm (oval) size from a top-down view were built and tested. First, a 4 Kb nanomagnet (no NCC reference) was fabricated using a design and method previously practiced by the inventors. Test results are shown in Table 1 for a MTJ having a BE/NiCr45/MnPt150/$Co_{75}Fe_{25}$23(AP2)/Ru7.5/$Co_{60}Fe_{20}B_{20}$15-$Co_{75}Fe_{25}$10(AP1)/MgO/$Co_{20}Fe_{60}B_{20}$ 19.5/Ru30/MnPt300/Ta300 configuration where the thickness for each layer is shown following the composition. In this The value of the critical switching current density $J_{C0}^{P-AP}$, $J_{C0}^{AP-P}$, according to the equation $J_C(\tau)=J_{C0}[1-K_BT/K_uV \ln(\tau/\tau_0)]$ was obtained by extrapolating the switching current density $J_C^{+,-}$ at 50 ns, 100 µs, and 900 µs to a pulse of $\tau_0$=1 ns where $\tau_0$=1 ns is the attempted frequency of thermal agitation. $K_u$ is the magnetic anisotropy energy, V is the free layer volume, and $k_B$ is the Bolzmann constant in the above equation. MTJs having at least one NCC layer in Table 1 have in-plane anisotropy with Ho less than 20 Oe. $Jc_0$ is given in units of $10^6$ A/$cm^2$.

$Jc_0$ for the best single NCC-MTJ and no NCC-MTJ is 2.6×$10^6$ A/$cm^2$ and 8.2×$10^6$ A/$cm^2$, respectively, which means a threefold reduction in $Jc_0$ when replacing a no NCC-MTJ with the best NCC-MTJ shown in Table 1. Note that the best result for a single NCC-MTJ is shown. However, $Jc_0$ (mean) for a plurality of MTJs made according to the process of record (POR) for a single NCC-MTJ having the same configuration as the best NCC-MTJ in Table 1 is 3.5×$10^6$ A/$cm^2$. The best NCC-MTJ has a higher Hc than the no NCC-MTJ while maintaining a small negative Ho value that facilitates P to AP switching as discussed previously. Ho may be adjusted by changing the AP1 or AP2 layer thickness but Ho is preferably kept within the range of −20 to 0 Oe. The thermal stability factor is also improved from Ea=31 to Ea=46 when replacing a no NCC-MTJ with the best NCC-MTJ. It should be understood that thermal stability factor Δ=Eb/kT is related to Hc (Bs). The required energy barrier against thermal disturb has been measured. For data retention, the Eb obtained without spin current is more relevant. We have determined that Hc>160 Oe is required to give a thermal stability factor Δ>55. For either of the dual NCC-MTJs listed in Table 1, Bs is ~0.7 and thermal stability factor Δ is >46. Since the NCC-MTJs listed in Table 1 are still short of the aforementioned requirements (Hc>160 and Δ>55), further optimization of the NCC-MTJ embodiments defined herein is necessary.

of about 330° C. offers the best compromise in terms of low Heff and high dR/R. In terms of RA, dR/R, VW, Hc, and $Jc_0$, a nanomagnet made of a $Co_{10}Fe_{70}B_{20}$ free layer is essentially equivalent to one made of a $Co_{20}Fe_{60}B_{20}$ free layer as shown in Table 2. Both samples were annealed at 330° C. VB is the breakdown voltage, VW is the write voltage, and VR is the read voltage.

TABLE 2

Magnetic Properties of MTJ with BE/NiCr45/MnPt150/$Co_{75}Fe_{25}$23/Ru7.5/$Co_{60}Fe_{20}B_{20}$15-$Co_{75}Fe_{25}$10/MgO/free layer/Ru30/MnPt300-Ta300 configuration

| Free layer | Bs | RA | dR/R | Rp | Rp_cov | Hc | $J_{CO}$ | VB (mV) | VW (mV) | VR (mV) |
|---|---|---|---|---|---|---|---|---|---|---|
| $Co_{20}Fe_{60}B_{20}$ 15.5/NCC8/$Co_{20}Fe_{20}$ 10 | 0.69 | 8.3 | 74% | 659 | 4.3 | 155 | 4.1 | 868 | 391 | 255 |
| $Co_{10}Fe_{70}B_{20}$ 15.5/NCC8/$Co_{10}Fe_{70}B_{20}$ 10 | 0.75 | 8.2 | 71% | 624 | 4.7 | 149 | 3.8 | 938 | 451 | 101 |

Figure 7:
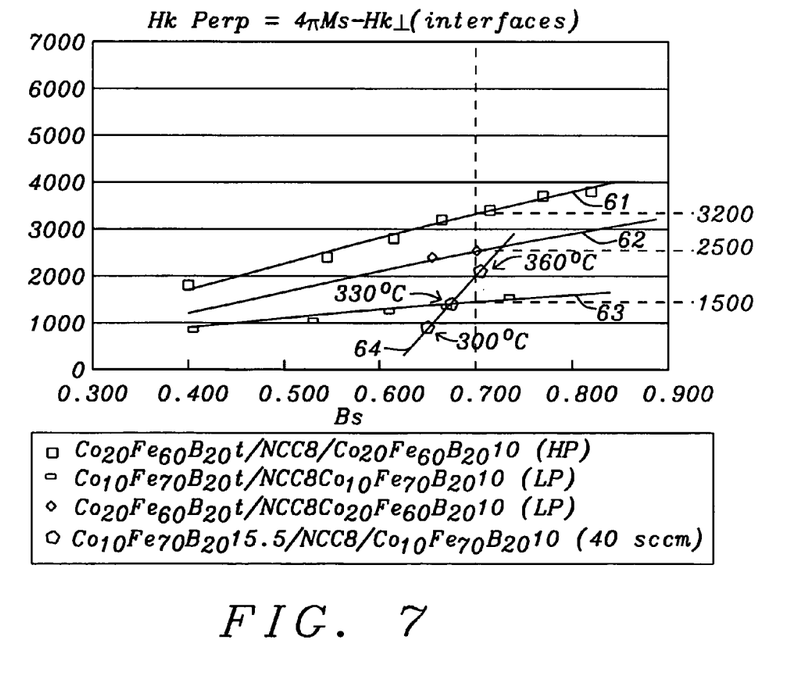
FIG. 7 is a plot of Bs vs. Heff for various MTJ configurations.

As a result of replacing a $Co_{20}Fe_{60}B_{20}$ composition with a $Co_{10}Fe_{70}B_{20}$ composition in FL1 layer 50 and FL2 layer 52 (first and third embodiments), and in each of the FL1 layer 50, FL2 layer 52, and FL3 layer 54 (second embodiment), we have found a further reduction in Heff=[4πMs−Hk⊥(interfacial)] for a NCC-MTJ free layer. Referring to FIG. 7, a plot of Bs vs. Heff is shown for various NCC-MTJ configurations where Heff (free layer)=4πMs−Hk⊥(interfacial). HP is a term that indicates a high pressure sputter deposition of the free layer with a process comprising a power of 50 Watts and a 1000 standard cubic centimeter per minute (sccm) Ar flow rate sputter. LP is a term indicating a low pressure sputter deposition with a power of 15 Watts and a 40 sccm Ar flow rate. Lines 61-64 represent the best linear fit of the data for various thicknesses (t) of the CoFeB free layer in the examples shown in the legend. Although the actual thickness for each data point in the graph is not provided, the trend is for Bs and Heff (Hk⊥) to decrease as thickness of the free layer increases. All samples were annealed at 330° C. for 1 hour with an applied field of 10000 Oe unless noted otherwise.

A comparison of line 61 to line 62 reveals a reduction in Heff from about 3200 Oe to 2500 Oe at Bs=0.7 (dashed vertical line). Thus, a low pressure sputter deposition of the free layer has been demonstrated to lower Heff and thereby lower $Jc_0$. Line 63 illustrates that Heff can be further lowered to 1500 at Bs=0.7 by switching free layer composition from $Co_{20}Fe_{60}B_{20}$ to $Co_{10}Fe_{70}B_{20}$ (s=10 in $Co_sFe_{(80-s)}B_{20}$) according to the embodiments of the present invention. In addition, line 64 shows the effect of the annealing temperature on Heff which increases as the temperature increases from 300° C. to 360° C. However, dR/R decreases as temperature is lowered. Thus, an intermediate anneal temperature Based on the results presented herein, we conclude that switching of an in-plane anisotropy NCC-MTJ is thermally assisted since $Jc_0$ is lower for all of the NCC-MTJs compared with the no NCC MTJ (Table 1). Moreover, damping constant α of a NCC-MTJ having a CoFeB/NCC/CoFeB free layer is significantly smaller than for a MTJ comprised of a CoFeB free layer but without a NCC layer. It is also noted that a CoFeB/NCC/CoFeB free layer results in a Heff reduction compared with a no NCC CoFeB free layer due to enhancing interfacial perpendicular anisotropy Hk⊥(interfacial). Moreover, Hk⊥(interfacial) increases as the CoFeB free layer thickness is reduced. We also observe that Hc and thermal stability Δ for a dual NCC-MTJ are larger than for a single NCC-MTJ at the same Bs.

As indicated earlier, a significant improvement in performance is realized when the Fe content in a Fe—$SiO_2$ NCC layer is reduced to about 20 atomic %. We estimate that replacing a Fe(25 atomic %)-$SiO_2$ NCC layer with a Fe(20 atomic %)-$SiO_2$ layer will generate 1.6 times more Joule heating to facilitate easier switching of the free layer. In order to evaluate dR/R tail (i.e. SBD %), a Cyclone test chip with a 1 Mbit array was fabricated. Magnetic performance of the Cyclone chips is summarized in Table 3 where the Fe content in the NCC layer is the only variable. Both samples were annealed at 330° C.

TABLE 3

Magnetic Properties of MTJ with BE/NiCr45/MnPt150/$Co_{75}Fe_{25}$23/Ru7.5/$Co_{60}Fe_{20}B_{20}$15-$Co_{75}Fe_{25}$10/MgO/free layer/Ru30/MnPt300-Ta300 configuration

| Free layer (FL1, FL2 = $Co_{20}Fe_{60}B_{20}$) | Bs | RA | dR/R | Rp | Rp_cov | Hc | $J_{CO}$ | VB (mV) | VW (mV) | VR (mV) | Ic0 |
|---|---|---|---|---|---|---|---|---|---|---|---|
| FL1 15.5/Fe(30%)—$SiO_2$ 8/FL2 10 | 0.7 | 5.0 | 83% | 797 | 5.2 | 155 | 4.1 | 951 | 600 | 210 | 0.472 |
| FL1 15.5/Fe(20%)—$SiO_2$ 7/FL2 6 | 0.7 | 5.0 | 87% | 735 | 5.5 | 177 | 3.8 | 888 | 500 | 125 | 0.384 |

As indicated above, it is estimated that a 7 Angstrom thick Fe(20 atomic %)-$SiO_2$ NCC layer generates about 50% more Joule heating than a Fe(25 atomic %)-$SiO_2$ NCC layer. Since writing for a NCC-MTJ is thermally assisted, $Jc_0$ (Ic0) for the nanomagnet having a Fe(20 atomic %)-$SiO_2$ NCC layer is reduced as is VW. Also, Hc for the nanomagnet with the Fe(20 atomic %)-$SiO_2$ layer is significantly larger than that with the Fe(30 atomic %)-SiO$_2$ NCC layer. Most importantly, dR/R tail % is greatly reduced from 0.59% for the reference to 0.05% for the MTJ with a Fe(20 atomic %)-SiO$_2$ NCC layer which is a level required for making a STT-RAM product.

In summary, a MTJ having a free layer with a FL1/NCC/FL2, FL1/NCC/FL2/NCC, or FL1/NCC/FL2/NCC/FL3 configuration where NCC has a Fe(20 atomic %)-SiO$_2$ composition and FL1, FL2, FL3 are Co$_{10}$Fe$_{70}$B$_{20}$ has achieved improved performance over the prior art in terms of providing Hc (and thermal stability factor Δ) near design requirements for a 64 Mbit device while maintaining a high magnetoresistive ratio (dR/R), low RA, and low Jc$_0$. Furthermore, a reduction in dR/R tail % (SBD %) is realized which satisfies a SBD % level required for STT-RAM products. Although the improvements highlighted above are currently directed towards enabling a 64 Mb STT-RAM technology, it is conceivable that the free layer embodiments (NCC MTJs) of the present invention will also be useful in advancing device development based on 65 nm and 45 nm technology nodes anticipated for 256 Mb STT-RAM and higher areal density devices.

While this invention has been particularly shown and described with reference to, the preferred embodiment thereof, it will be understood by those skilled in the art that various changes in form and details may be made without departing from the spirit and scope of this invention.

We claim:

1. A MTJ nanopillar structure formed on a bottom electrode in a STT-RAM device, comprising:
    (a) a synthetic anti-ferromagnetic (SyAF) pinned layer with an AP2/coupling/AP1 configuration wherein AP2 and AP1 are ferromagnetic layers separated by a coupling layer;
    (b) a MgO tunnel barrier that forms an interface with the AP1 layer; and
    (c) a composite free layer that forms an interface with the MgO tunnel barrier, and having a FL1/NCC/FL2, FL1/NCC/FL2/NCC, or FL1/NCC/FL2/NCC/FL3 configuration wherein FL1, FL2, and FL3 are magnetic layers and NCC is a nanocurrent channel layer comprised of R(M) grains having a certain grain diameter size that are formed in a metal (M) oxide, nitride, or oxynitride insulator matrix, R is Fe, Ni, or Co, or a combination thereof with a 20 atomic % content in a NCC layer, and M is a metal.

2. The MTJ nanopillar structure of claim 1 wherein the FL1 and FL2 layers in the FL1/NCC/FL2 and FL1/NCC/FL2/NCC configurations, and the FL1, FL2, and FL3 layers in the FL1/NCC/FL2/NCC/FL3 configuration are comprised of CoFeB, and interfaces between said CoFeB layers and the one or more NCC layers enhance interfacial perpendicular anisotropy in the CoFeB layers.

3. The MTJ nanopillar structure of claim 1 wherein the AP1 layer is made of CoFeB, the composite free layer has a FL1/NCC/FL2 configuration wherein said FL1 layer and FL2 layer have the same Co$_S$Fe$_{(80-S)}$B$_{20}$ composition where S is between 10 and 20, the FL1 layer has a thickness from about 14.5 to 15.5 Angstroms and contacts the MgO tunnel barrier, the FL2 layer has a thickness between about 6 and 8.5 Angstroms, and the NCC layer is comprised of Fe(20 atomic %)-SiO$_2$ with a thickness from about 6 to 10 Angstroms.

4. The MTJ nanopillar structure of claim 1 wherein the composite free layer has a FL1/NCC1/FL2/NCC2/FL3 configuration wherein said FL1 layer has a thickness from about 13.5 to 14.5 Angstroms and contacts the MgO tunnel barrier, the FL1, FL2 and FL3 layers are comprised of the same Co$_S$Fe$_{(80-S)}$B$_{20}$ composition wherein S is between 10 and 20, the FL2 layer is from about 4.5 to 5.5 Angstroms thick and the FL3 layer is from about 6 to 8.5 Angstroms thick, and the NCC layers are comprised of Fe(20 atomic %)-SiO$_2$ with a thickness from about 6 to 10 Angstroms.

5. The MTJ nanopillar structure of claim 1 wherein the composite free layer has a FL1/NCC1/FL2/NCC2 configuration wherein said FL1 layer has a thickness from about 14.5 to 15.5 Angstroms and contacts the MgO tunnel barrier, the FL1 layer and FL2 layer have the same Co$_S$Fe$_{(80-S)}$B$_{20}$ composition wherein S is between 10 and 20, the FL2 layer has a thickness between about 6 to 8.5 Angstroms, and the NCC layers are comprised of Fe(20 atomic %)-SiO$_2$ with a thickness from about 6 to 10 Angstroms.

6. The MTJ nanopillar structure of claim 1 wherein the MTJ nanopillar structure is comprised of a seed layer, an anti-ferromagnetic (AFM) layer, the SyAF pinned layer, the MgO tunnel barrier, the composite free layer, a capping layer, and a hard mask layer that are sequentially formed on the bottom electrode.

7. The MTJ nanopillar structure of claim 6 wherein the capping layer is made of Ru and the hard mask layer is has a MnPt/Ta configuration wherein the Ta layer is an uppermost layer in the MTJ nanopillar structure.

8. The MTJ nanopillar structure of claim 1 wherein the SyAF pinned layer has a CoFeB/Ru/CoFeB/CoFe configuration wherein the AP1 layer is comprised of CoFeB/CoFe and the CoFe layer contacts the MgO tunnel barrier.

9. The MTJ nanopillar structure of claim 1 wherein all of the FL1, FL2, and FL3 layers are comprised of Co$_{10}$Fe$_{70}$B$_{20}$, and each NCC layer has a Fe(20 atomic %)-SiO$_2$ composition.

10. The MTJ nanopillar structure of claim 1 wherein R is Fe, M is Si, and the certain diameter grain size is about 10 Angstroms.

11. A MTJ nanopillar structure formed on a bottom electrode in a STT-RAM device, comprising:
    (a) a synthetic anti-ferromagnetic (SyAF) pinned layer with an AP2/coupling/AP1 configuration;
    (b) a MgO tunnel barrier that forms an interface with the AP1 layer; and
    (c) a composite free layer that forms an interface with the MgO tunnel barrier, and having a FL1/NCC/FL1, FL1/NCC/FL2/NCC, or FL1/NCC/FL2/NCC/FL3 configuration wherein FL1, FL2, and FL3 are all magnetic layers comprised of Co$_{10}$Fe$_{70}$B$_{20}$ and NCC is a nanocurrent channel layer comprised of R(M) grains that are formed in a metal (M) oxide, nitride, or oxynitride insulator matrix, and R is Fe, Ni, or Co, or a combination thereof with a content of 20 atomic % in a NCC layer, and M is a metal.

12. The MTJ nanopillar structure of claim 11 wherein each NCC nanocurrent channel layer has a thickness between about 6 and 10 Angstroms and is comprised of Fe(20 atomic %)-SiO$_2$.

* * * * *